United States Patent
Taghivand

(10) Patent No.: US 8,742,862 B1
(45) Date of Patent: Jun. 3, 2014

(54) CURRENT REUSE VOLTAGE CONTROLLED OSCILLATOR WITH IMPROVED DIFFERENTIAL OUTPUT

(71) Applicant: QUALCOMM Incorporated, San Diego, CA (US)

(72) Inventor: Mazhareddin Taghivand, Campbell, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/676,007

(22) Filed: Nov. 13, 2012

(51) Int. Cl.
*H03L 7/00* (2006.01)
*H03B 1/00* (2006.01)

(52) U.S. Cl.
USPC ............ 331/167; 331/34; 331/16; 331/1 A; 331/117 R; 331/117 FE; 327/156; 327/159; 327/44; 375/260

(58) Field of Classification Search
USPC ............ 331/167, 117 FE, 117 R, 1 A, 34, 57; 327/156, 159; 375/260
See application file for complete search history.

(56) References Cited

U.S. PATENT DOCUMENTS

| 6,542,043 B1 | 4/2003 | Cao |
| 7,088,169 B2 | 8/2006 | Erba et al. |
| 8,018,293 B2 * | 9/2011 | Rangarajan et al. .... 331/117 FE |
| 8,073,078 B2 | 12/2011 | Kaczman et al. |
| 2011/0032044 A1 | 2/2011 | Lee et al. |

OTHER PUBLICATIONS

Yun, et al., "A 1 mW Current-Reuse CMOS Differential LC-VCO with Low Phase Noise," 2005 IEEE International Solid-State Circuits Conference, Solid-State Circuit Conference, Digest of Technical Papers ISSCC, Session 29, RF Techniques, 29.6, pp. 540-541 & 616. 2005.

* cited by examiner

*Primary Examiner* — Arnold Kinkead
(74) *Attorney, Agent, or Firm* — Kenyon S. Jenckes

(57) ABSTRACT

A current reuse voltage controlled oscillator with improved differential output is disclosed. In an exemplary embodiment, an apparatus includes a PMOS transistor and an NMOS transistor coupled together for current reuse and configured to provide differential oscillator outputs. The apparatus also includes a common mode rejection (CMR) circuit coupled between the PMOS and the NMOS transistors, the CMR circuit includes an inductor having a least one tap that can be selectively coupled to a ground to reduce common mode signals at the differential oscillator outputs.

18 Claims, 8 Drawing Sheets

CURRENT REUSE VOLTAGE CONTROLLED OSCILLATOR WITH IMPROVED DIFFERENTIAL OUTPUT

BACKGROUND

1. Field

The present application relates generally to the operation and design of electronic circuits, and more particularly, to the operation and design of voltage controlled oscillators.

2. Background

Current reuse voltage controlled oscillator (VCO) topologies may have superior power and phase noise performance when compared to other known VCO topologies. Therefore, it is very attractive to use a current reuse VCO topology in any RF transceiver where power consumption and phase noise is a concern. However, a current reuse VCO may not provide truly differential output signals. For example, a conventional current reuse VCO may be susceptible to common mode noise that can degrade the gain and/or phase symmetry of the differential output signals. This could be a problem in transceiver designs where the VCO output signals are assumed to be truly differential, but non-symmetric gain and/or phase characteristics contribute to I/O phase and/or gain mismatches.

Therefore, what is provided is a current reuse VCO having differential outputs with improved gain and/or phase symmetry.

BRIEF DESCRIPTION OF THE DRAWINGS

The foregoing aspects described herein will become more readily apparent by reference to the following description when taken in conjunction with the accompanying drawings wherein.

DETAILED DESCRIPTION

The detailed description set forth below in connection with the appended drawings is intended as a description of exemplary embodiments of the invention and is not intended to represent the only embodiments in which the invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

Figure 1:
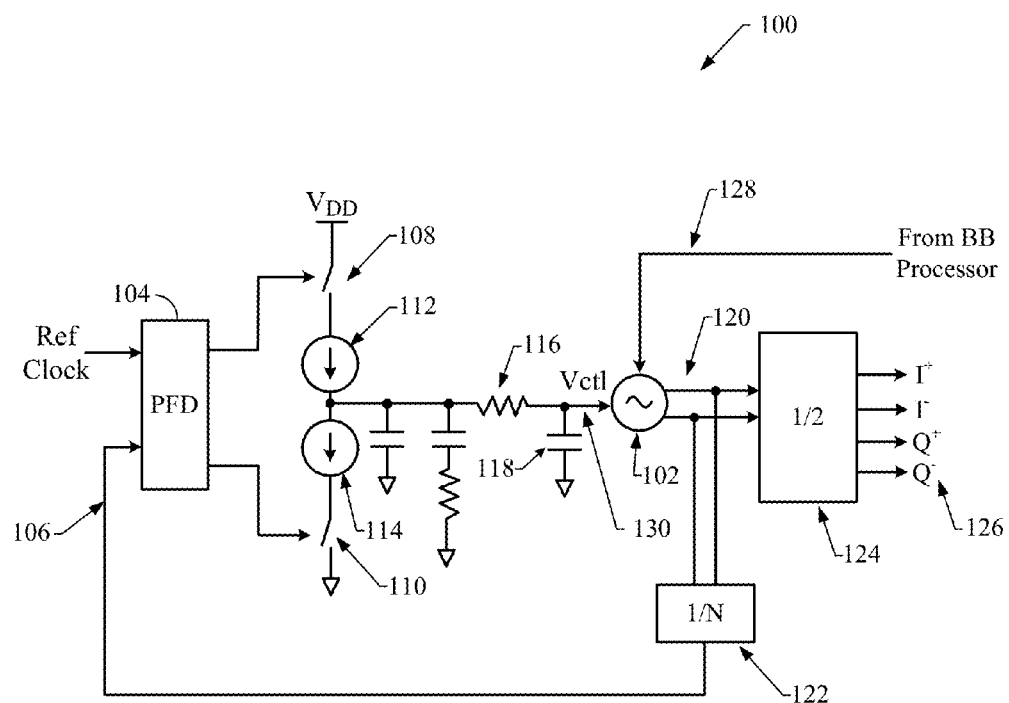
FIG. 1 illustrates an exemplary embodiment of a current reuse VCO for use in a frequency synthesizer.

FIG. 1 illustrates an exemplary embodiment of a novel current reuse VCO 102 for use in a frequency synthesizer 100. As illustrated in FIG. 1, the frequency synthesizer 100 comprises a phase/frequency detector (PFD) 104 that receives a reference clock (Ref) signal and a feedback signal 106. The PFD 106 outputs charge pump controls signals that control the operation of a charge pump comprising switches 108, 110 and current sources 112, 114. The charge pump output is filtered by resistor 116 and capacitor 118 to generate a VCO control signal (Vctl) that is input to the current reuse VCO 102.

In various exemplary embodiments, the current reuse VCO 102 comprises features that improve the differential characteristics of its differential outputs 120. For example, the gain and/or phase symmetry of the differential outputs 120 are improved over conventional current reuse VCOs.

The differential outputs 120 are input to a divide-by-N module 122 that generates the feedback signal 106 that is input to the PFD 104. The differential outputs 120 are also input to a divide-by-2 module 124 that generates I and Q differential signals as shown generally at 126. The I and Q signals 126 can be input to a mixer or other functional element of a transceiver.

In an exemplary embodiment, a baseband (BB) processor detects gain or phase mismatches of baseband I and Q signals and generates a BB detection signal 128 that is input to the VCO 102 and is used by the VCO 102 to improve the gain/phase symmetry of the differential output signals 120. A more detail description of the current reuse VCO 102 is provided below.

Figure 2:
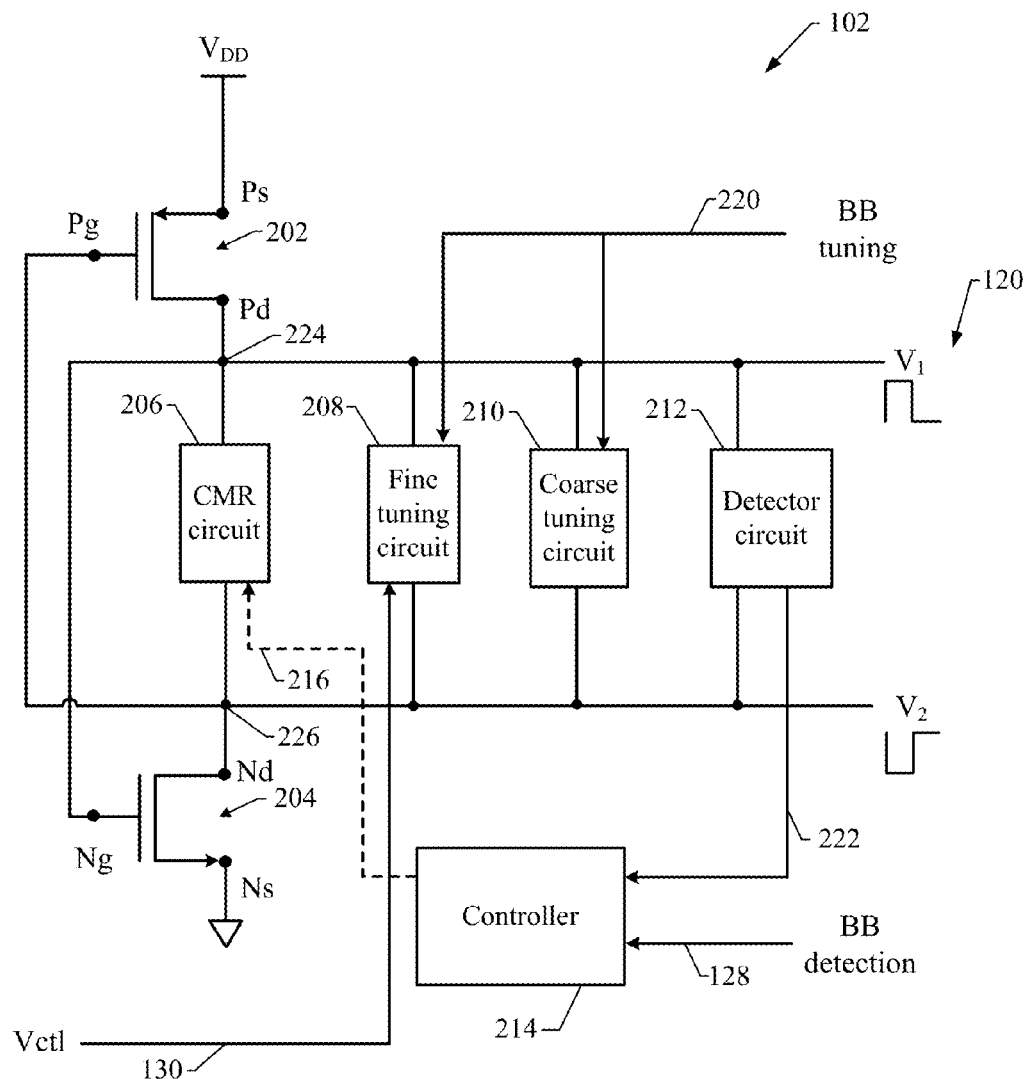
FIG. 2 shows an exemplary embodiment of the current reuse VCO shown in FIG. 1.

FIG. 2 shows an exemplary embodiment of the current reuse VCO 102. The VCO 102 comprises PMOS transistor 202 having gate, drain, and source terminals (Pg, Pd, Ps) coupled in a current reuse configuration to NMOS transistor 204 having gate, drain, and source terminals (Ng, Nd, Ns). The transistors 202 and 204 are coupled to differential output terminals 224, 226 that output differential output signals (V1 and V2). Connected between the output terminals 224, 226 are common-mode rejection (CMR) circuit 206, fine tuning circuit 208, coarse tuning circuit 210 and detector circuit 212.

A controller 214 operates to provide a CMR control signal 216 to control the CMR circuit 206. The fine tuning circuit 208 and coarse tuning circuit 210 receive tuning control signal 220 from a baseband (BB) processor or other entity. The detector 212 operates to detect characteristics of the differential output signals V1, V2 and generates a detection signal 222 that is input to the controller 214. For example, the detector 212 may be a peak detector that can determine the symmetry of the differential output signals (V1, V2) and generate the detection signal 222 in response. The controller 214 also receives a BB detection signal 128 that provides indications of I/O mismatches detected during baseband processing. The Vctl signal 130 is input directly to the fine tuning circuit 208 and operates to fine tune and lock the frequency of the VCO 102.

During operation, the current reuse VCO 102 generates the differential output signals V1 and V2, which may be used by a mixer or other functional element of a transceiver. The tuning control signal 220 controls the coarse tuning circuit 210 to set the coarse frequency of the VCO. The tuning control signal 220 also controls the tuning of the fine tuning circuit 208 to set the fine resolution of the frequency of the VCO. The controller 214 generates the CMR control signal 216 to control the CMR circuit 206 to reduce any common mode signals that may degrade the symmetry of the differential output signals (V1, V2). For example, the controller 214 controls the CMR circuit 206 to improve the gain and/or phase symmetry of the differential output signals (V1, V2).

In an exemplary embodiment, the controller 214 receives the detection signal 222 from the detector 212 and uses this signal to generate the CMR control signal 216 to reduce detected asymmetry of the differential output signals. In another exemplary embodiment, the controller 214 receives the BB detection signal 128 and uses this signal to generate the CMR control signal 216 to control the CMR circuit 206 to reduce detected asymmetry of the differential output signals and thereby reduce I/O mismatches or other conditions detected by the BB processor.

Figure 3:
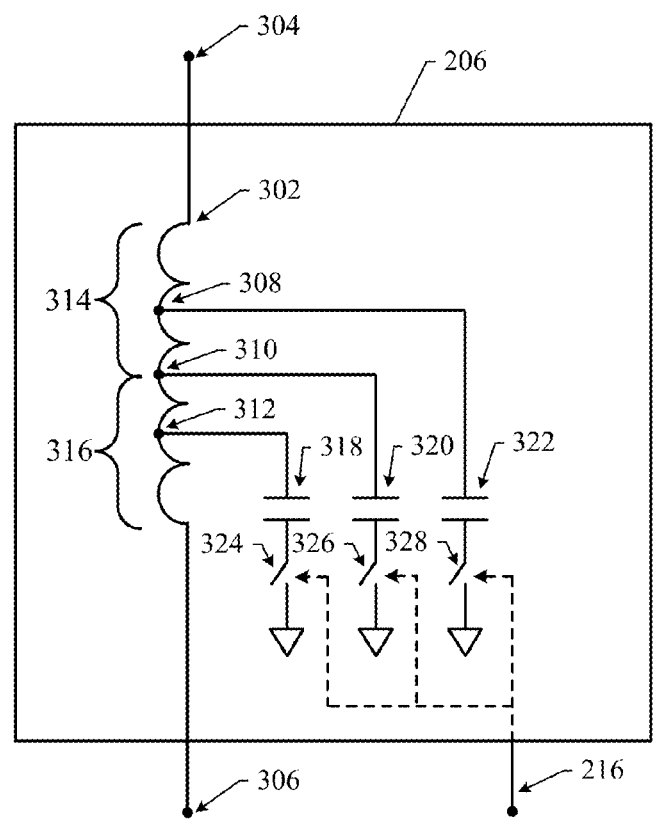
FIG. 3 shows a detailed exemplary embodiment of a common mode rejection circuit.

FIG. 3 shows a detailed exemplary embodiment of the CMR circuit 206. The CMR circuit 206 comprises an inductor 302 having a first terminal 304 and a second terminal 306. The inductor 302 comprises one or more taps. For example, the inductor 302 comprises a first tap 308, a second tap 310 and a third tap 312. In an exemplary embodiment, the second tap 310 is a center tap. Each tap divides the inductor 302 into two inductor portions having corresponding inductance values. For example, the center tap 310 divides the inductor 302 into a first inductor portion 314 and a second inductor portion 316. Since the tap 310 is a center tap, the first inductor portion 314 and the second inductor portion 316 have substantially equal inductance values. However, other taps, such as tap 308, may divide the inductor 302 into inductor portions having different inductance values and the inductor 302 may comprise any number of taps.

In an exemplary embodiment, each tap is connected to a capacitor. For example, the tap 308 is connected capacitor 322, the tap 310 is connected to capacitor 320, and the tap 312 is connected to capacitor 318. Each capacitor is connected to a corresponding switch. For example, the capacitor 318 is connected to switch 324, the capacitor 320 is connected to switch 326 and the capacitor 322 is connected to switch 328. Each switch operates to connect or disconnect its associated capacitor to a ground based on the CMR control signal 216. In an exemplary embodiment, the CMR control signal 216 comprises a plurality of bits and each bit is assigned to control one switch of the CMR circuit 206. During operation, the CMR control signal 216 provides control to enable one of the switches to close while keeping the remaining switches open thereby connecting a selected capacitor and its corresponding tap to ground. Thus, the corresponding tap is AC coupled to ground through the selected capacitor. By AC coupling the selected tap of the inductor 302 to ground, common mode signals are removed from the differential output signals V1 and V2. As a result, the differential output signals appear as true differential signals (i.e., improved symmetry) without the effects of the common mode signals and therefore I/O phase and/or gain mismatches are reduced.

Figure 4:
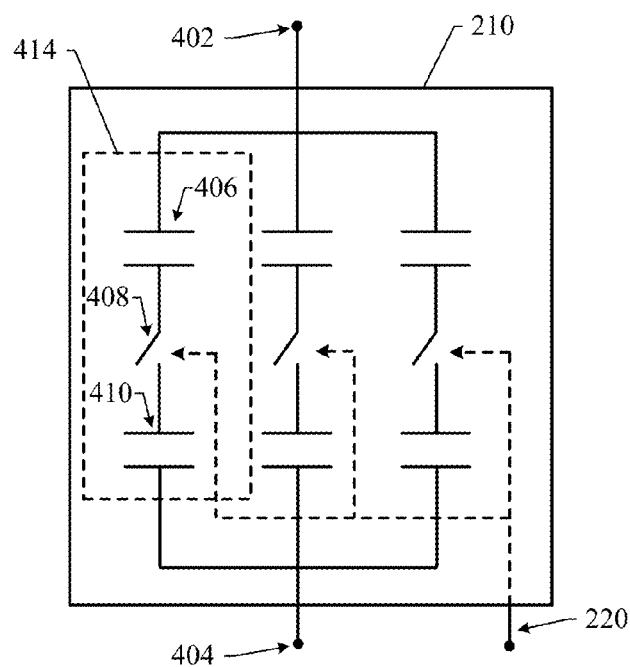
FIG. 4 shows a detailed exemplary embodiment of a coarse tuning circuit.

FIG. 4 shows a detailed exemplary embodiment of the coarse tuning circuit 210. The coarse tuning circuit 210 comprises a first terminal 402 and a second terminal 404 connected to one or more coarse tuning signal branches (i.e, coarse tuning branch 414). The coarse tuning signal branch 414 comprises a first capacitor 406 connected to the first terminal 402 and to a switch 408. The switch 408 is further connected to a second capacitor 410 that is connected to the second terminal 404. In an exemplary embodiment, the tuning control signal 220 comprises a plurality of bits and each bit is assigned to control a switch in each signal branch. During operation, the tuning control signal 220 provides control to close one or more of the switches and open the remaining switches thereby enabling one or more of the coarse tuning signal branches (and their associated capacitance) into the coarse tuning circuit. By enabling the appropriate signal branches, coarse tuning of the VCO frequency can be performed.

Figure 5:
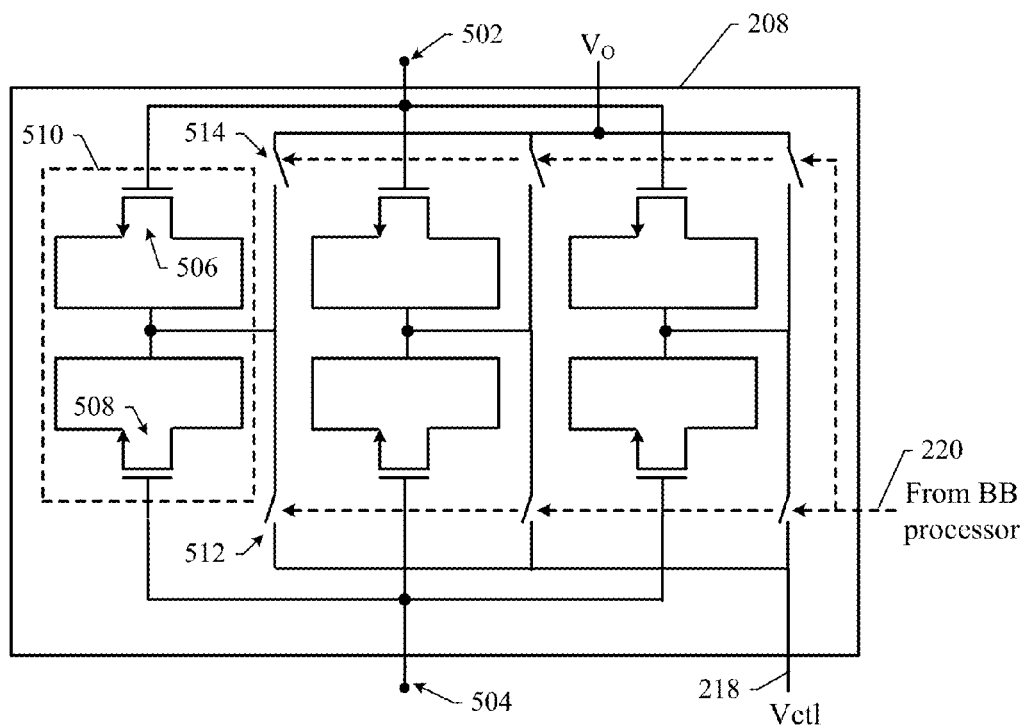
FIG. 5 shows a detailed exemplary embodiment of a fine tuning circuit.

FIG. 5 shows a detailed exemplary embodiment of the fine tuning circuit 208. The fine tuning circuit 208 comprises a first terminal 502 and a second terminal 504 connected to one or more fine tuning signal branches (i.e., branch 510). The fine tuning signal branch 510 comprises a first NMOS transistor 506 coupled to a second NMOS transistor 508. In an exemplary embodiment, the tuning control signal 220 from the BB processor comprises a plurality of control signals and each control signal is assigned to control switches associated with each fine tuning branch. For example, the tuning control signal 220 controls the operation of the switches 512, 514 that are associated with the fine tuning branch 510. When the switch 512 is open so that the branch 510 is disabled, the switch 514 is closed so that the fine tuning branch 510 is coupled to an "off" voltage $V_O$. Any disabled branches are coupled to the voltage $V_O$ so that the disabled branches will not be left in a floating state.

During operation, the Vctl signal 218 is provided to one or more of the fine tuning signal branches via the switches (i.e., switch 512). By enabling the Vclt signal 218 to the appropriate signal branches, (i.e., by closing switch 512 and opening switch 514) a variable capacitance is obtained that provides fine tuning of the VCO frequency. In an exemplary embodiment, the baseband processor provides the tuning control signal 220 to binary weight or thermometer weight the selection of the switches to determine which fine tuning signal branches are connected to receive the Vclt signal 218 and thus the amount of fine tuning provided.

Figure 6:
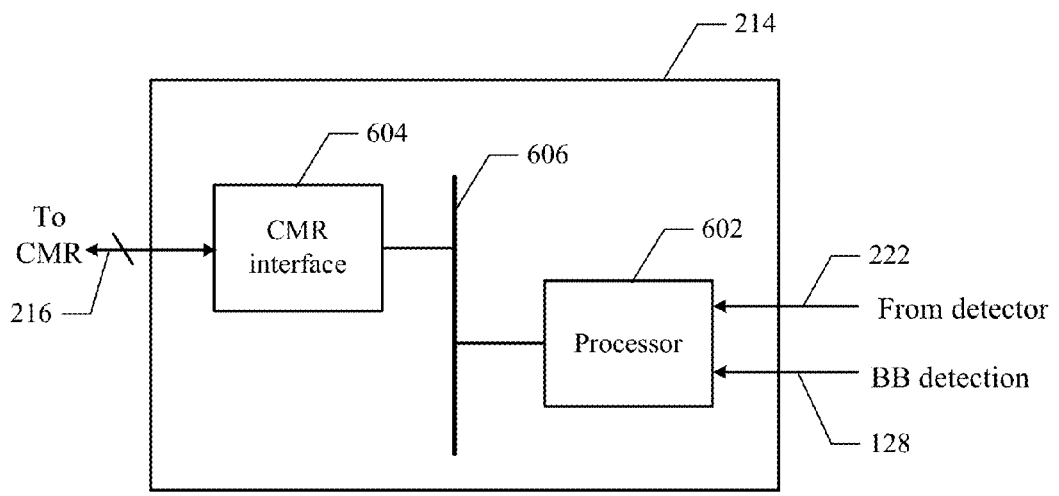
FIG. 6 shows a detailed exemplary embodiment of a controller.

FIG. 6 shows an exemplary embodiment of the controller 214. The controller 214 comprises processor 602 and CMR interface 604 coupled to communicate over bus 606. It should be noted that the controller 214 is just one implementation and that other implementations are possible.

The CMR interface 604 comprises hardware and/or hardware executing software that operates to allow the controller 214 to program the CMR circuit 206. For example, the CMR interface 604 outputs the CMR control signal 216 that controls the CMR circuit 206 to select a particular inductor tap to be coupled to ground to reduce common mode signals at the differential outputs of the current reuse VCO 102. For example, in an exemplary embodiment, the CMR control signal 216 includes a plurality of bits and each bit is coupled to a corresponding switch of the CMR circuit 214 to select a selected inductor tap to be coupled to ground. The CMR interface 604 is controlled by operation of the processor 602.

The processor 602 comprises at least one of a CPU, processor, gate array, hardware logic, memory elements, and/or hardware executing software. The processor 602 operates to control the CMR interface 604 to perform the functions described herein. For example, in an exemplary embodiment, the processor 602 comprises instructions or codes that are stored or embodied in a memory and the processor 602 executes these instructions or codes to provide the functions described herein.

In an exemplary embodiment, the processor 602 receives the detection signal 222 from the detection circuit 212 and operates to control the CMR interface 604 based on the detection signal 222 to generate the CMR control signal 216 to coupled a selected inductor tap to ground to remove detected common mode signals from the differential outputs of a current reuse VCO.

In another exemplary embodiment, the processor 602 receives the BB detection signal 128 from a BB processor and operates to control the CMR interface 604 based on the detection signal 128 to generate the CMR control signal 216 to couple a selected inductor tap to ground to remove I/O mismatches detected at the baseband level by the BB processor. For example, in an exemplary embodiment, the BB detection signal 128 is a digital detection signal determined after down-conversion of a received RF signal. A more detailed description of the operation of the controller 214 is provided below.

Figure 7:
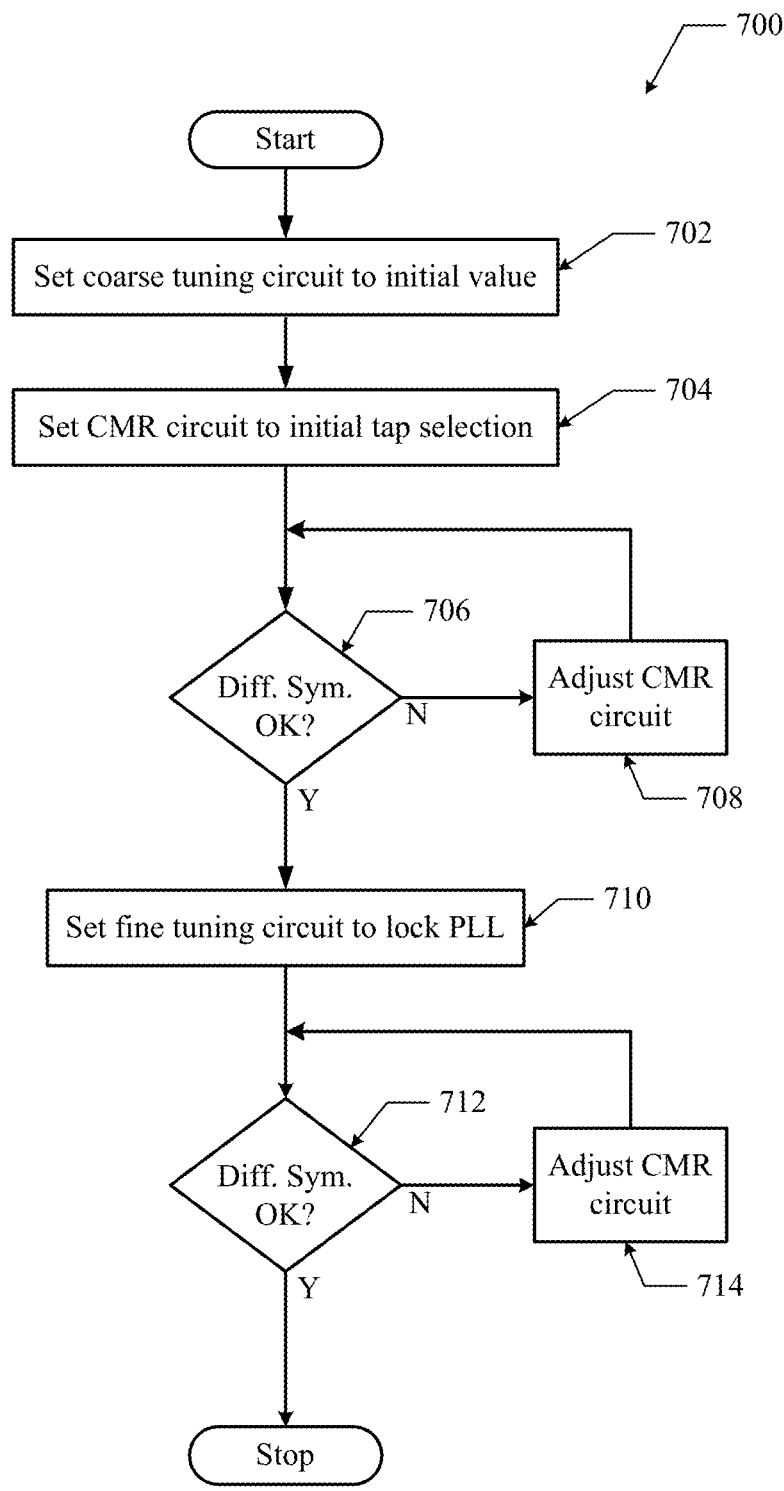
FIG. 7 shows an exemplary method for operating a current reuse VCO to provide improved differential output.

FIG. 7 illustrates an exemplary method 700 for operating a current reuse VCO to provide improved differential output signals. For example, the method 700 is suitable for use by the VCO 102 shown in FIG. 2. In one exemplary implementation, the processor 602 executes one or more sets of codes or instructions stored or embodied in a memory to control the controller 214 to perform the functions described below.

At block 702, coarse tuning of a current reuse VCO is set. In an exemplary embodiment, the coarse tuning circuit 210 is set to a coarse tuning value by the tuning control signal 220 from a baseband processor. This sets the coarse frequency of the differential output (V1, V2) of the VCO 102.

At block 704, the CMR circuit is set to an initial tap selection to reduce asymmetries of the differential outputs (V1, V2) of the VCO 102. In an exemplary embodiment, the processor 602 controls the CMR interface 604 to set the CMR control signal 216 to select the appropriate tap (initial tap selection) of the inductor 302 to be coupled to ground so as to remove common mode signals from the VCO differential outputs (V1, V2) and thereby improve differential symmetry. In an exemplary embodiment, the center tap 310 is selected. In other exemplary embodiments, an inductor tap other than the center tap is selected.

At block 706, a determination is made as to whether the differential output is symmetric. For example, the processor 602 makes this determination by receiving the detection signal 222 from the detector circuit 212 and processes this signal to determine if there are asymmetries associated with the differential output signals (V1, V2) that can be corrected by the CMR circuit 206. For example, if common mode signals are contributing to the asymmetries of the differential output signals, then the processor 602 can adjust the CMR circuit 206 to remove the common mode signals. If the differential output signals are not symmetric, the method proceeds to block 708. If the differential output signals are symmetric, the method proceeds to block 710.

At block 708, the CMR circuit is adjusted to remove common mode signals from the differential outputs of the VCO. In an exemplary embodiment, the processor 602 controls the CMR interface 604 to set the CMR control signal 216 to select the appropriate tap of the inductor 302 to be coupled to ground so as to remove common mode signals from the VCO differential outputs (V1, V2) and thereby improve differential symmetry as detected by the detector circuit 212. In an exemplary embodiment, the center tap 310 is selected. In other embodiments, a different inductor tap is selected based on which tap yields the desired VCO output symmetry as indicated by the detection signal 222.

At block 710, fine tuning of a current reuse VCO is set. In an exemplary embodiment, the fine tuning circuit 208 is set to a fine tuning value by the tuning control signal 220 from a baseband processor. This sets the fine frequency resolution of the VCO 102 so that the Vctl signal 130 can achieve a frequency lock for a phase lock loop circuit as illustrated in FIG. 1.

At block 712, a determination is made as to whether the differential output is symmetric. For example, the processor 602 makes this determination by receiving the BB detection signal 128 from the baseband processor and processing this signal to determine if there are asymmetries associated with the differential output signals (V1, V2) that can be corrected by the CMR circuit 206. For example, if common mode signals are contributing to the asymmetries of the differential output signals, then the processor 602 can adjust the CMR circuit 206 to remove the common mode signals. If the differential output signals are not symmetric, the method proceeds to block 714. If the differential output signals are symmetric, the method ends.

At block 714, the CMR circuit is adjusted to remove common mode signals from the differential outputs of the VCO. In an exemplary embodiment, the processor 602 controls the CMR interface 604 to set the CMR control signal 216 to select the appropriate tap of the inductor 302 to be coupled to ground so as to remove common mode signals from the VCO differential outputs (V1, V2) and thereby improve differential symmetry as detected by the baseband processor and as indicated by the detection signal 128. In an exemplary embodiment, the center tap 310 is selected. In other embodiments, a different inductor tap is selected based on which tap yields the desired VCO output symmetry as indicated by the detection signal 128.

Therefore, the method 700 operates to improve the symmetry of the differential output signals of a current reuse VCO. It should be noted that the method 700 is just one implementation and that the operations of the method 700 may be rearranged or otherwise modified such that other implementations are possible.

Figure 8:
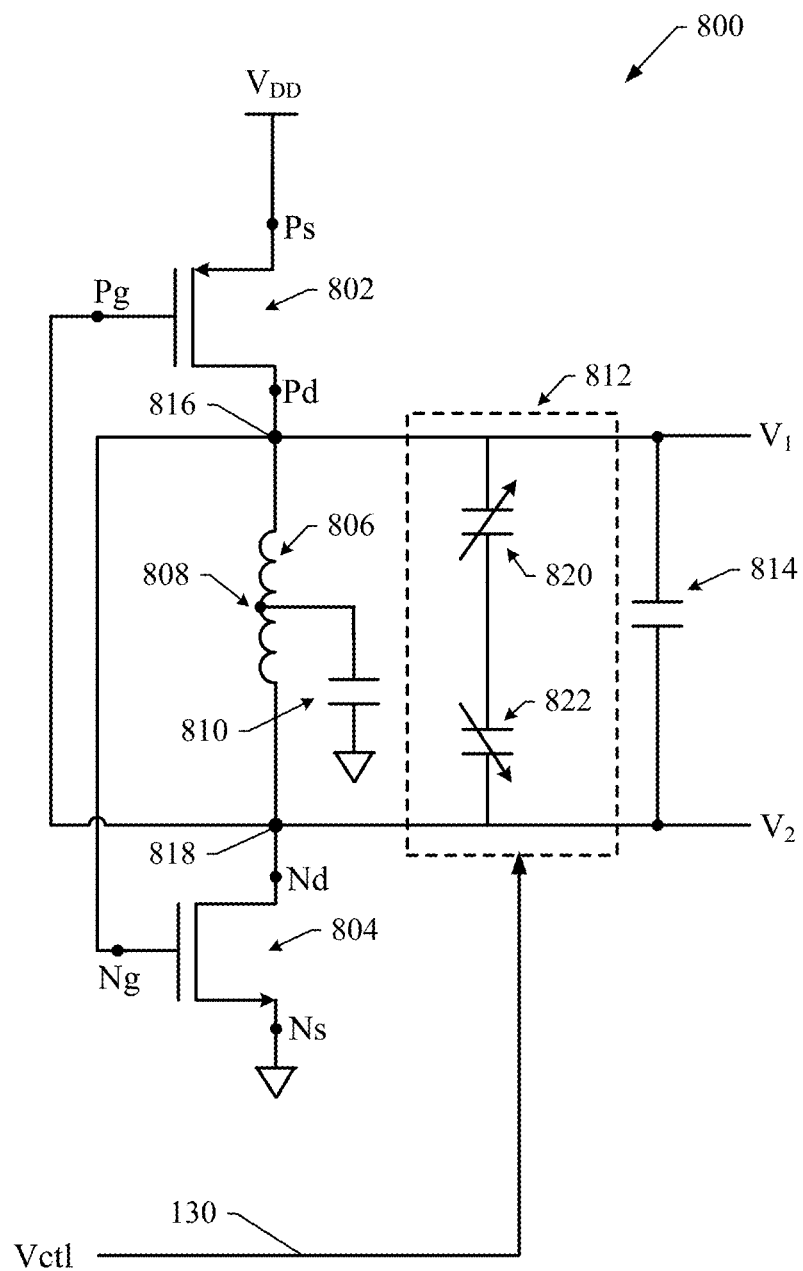
FIG. 8 shows an exemplary embodiment of a current reuse VCO.

FIG. 8 shows an exemplary embodiment of a current reuse VCO 800. For example, the VCO 800 is just one exemplary implementation provided for illustrative purposes. The VCO 800 comprises PMOS transistor 802 having gate, drain, and source terminals (Pg, Pd, Ps) coupled in a current reuse configuration to NMOS transistor 804 having gate, drain, and source terminals (Ng, Nd, Ns). The transistors 802 and 804 are coupled to differential output terminals 816, 818 that output differential output signals (V1 and V2). Connected between the output terminals 816, 818 is a three terminal inductor 806 having a tap 808 that is couple to ground through capacitor 810. Also connected between the output terminals 816, 818 are fine tuning circuit 812 and coarse tuning capacitor 814.

The tap 808 is connected to ground through capacitor 810 thereby forming an LC tank circuit. A coarse tuning capacitor 814 is connected between the differential outputs V1, V2 to provide coarse frequency tuning. A variable fine tuning circuit 812 is also connected between the differential outputs V1, V2 to provide fine frequency tuning. The fine frequency circuit 812 comprises variable capacitors 820 and 822 which vary their capacitance based on the control signal Vctl 130. Accordingly, the Vctl signal 130 can control the fine frequency adjustment and lock the output frequency of the VCO 800.

During operation, the combination of the inductor 806 and capacitor 810 operate to remove common mode signals from the differential outputs V1 and V2 to improve their differential symmetry. For example, the tap terminal 808 is AC coupled to ground through the capacitor 810. The AC coupling removes common mode signals across the LC tank circuit of the VCO. The result is that the VCO output signals (V1, V2) have improved symmetry. In an exemplary embodiment, the tap 808 is a center tap that divides the inductor 806 into two inductance portions having substantially equal inductance values. In another exemplary embodiment, the tap 808 is not a center tap and divides the inductor 806 into two inductance portions having substantially unequal inductance values.

Figure 9:
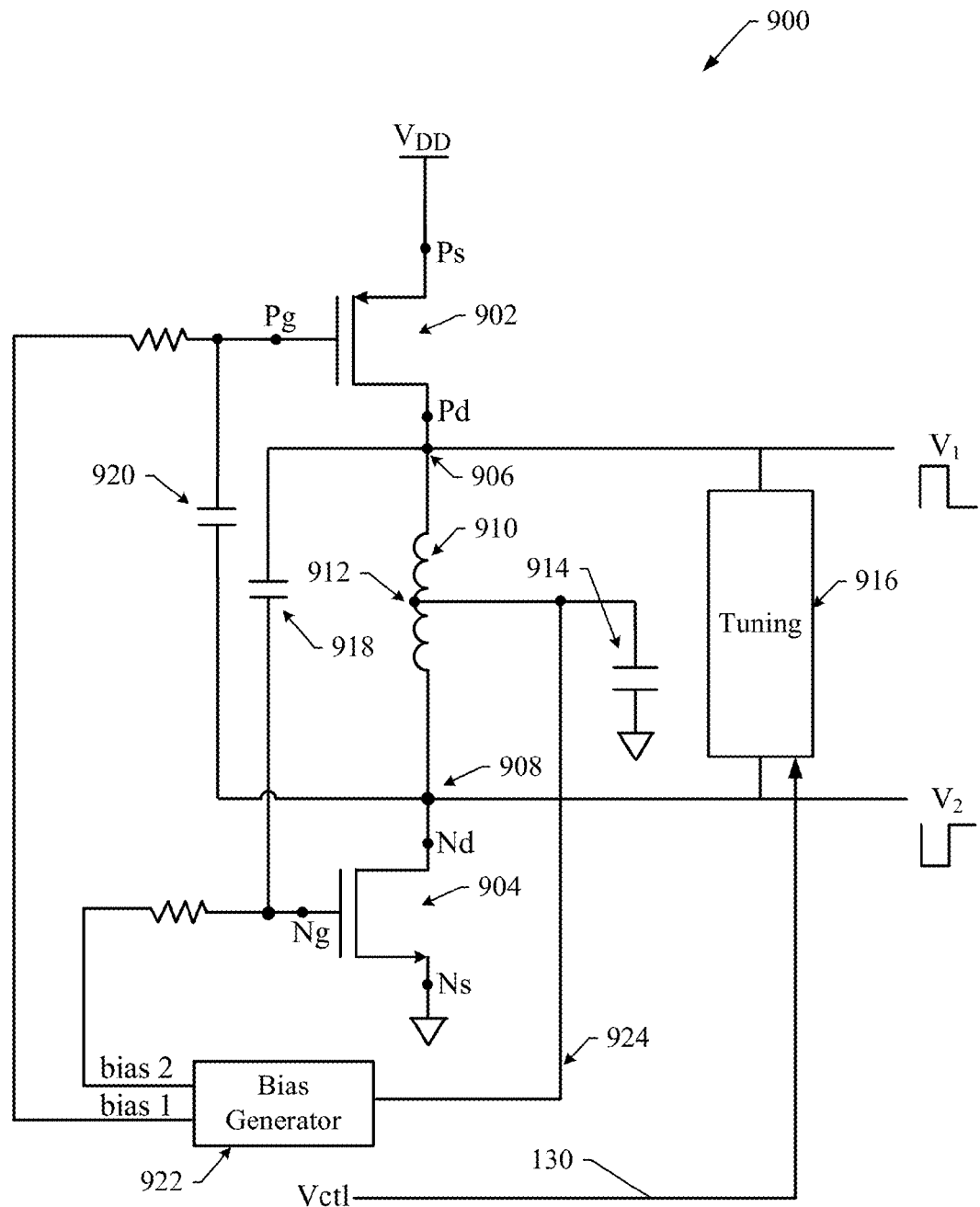
FIG. 9 shows an exemplary embodiment of a current reuse VCO.

FIG. 9 shows an exemplary embodiment of a current reuse VCO 900. The VCO 900 comprises PMOS transistor 902 having gate, drain, and source terminals (Pg, Pd, Ps) coupled in a current reuse configuration to NMOS transistor 904 having gate, drain, and source terminals (Ng, Nd, Ns). The transistors 902 and 904 are coupled to differential output terminals 906, 908 that output differential output signals (V1 and V2). Connected between the drain terminals of the transistors 902, 904 is a three terminal inductor 910 having tap 912. The tap 912 is connected to ground through capacitor 914 thereby forming an LC tank circuit. A tuning circuit 916 is connected between the differential outputs V1, V2 to provide frequency tuning in response to the Vctl signal 130.

During operation, the combination of the inductor 910 and capacitor 914 operate to remove common mode signals from the differential outputs V1 and V2 to improve their differential symmetry. For example, the tap terminal 912 is AC coupled to ground through the capacitor 914. The AC coupling removes common mode signals across the LC tank circuit of the VCO 900. The result is that the VCO output signals (V1, V2) have improved symmetry. In one exemplary embodiment, the tap 912 is a center tap. In another exemplary embodiment, the tap 912 is not a center tap.

The transistors 902, 904 are AC coupled with capacitors 918 and 920 allowing their gate bias signals to be independently set so that a lower VDD supply voltage can be used to reduce power consumption. In one exemplary embodiment, a bias generator 922 receives a sense signal 924 detected at the tap 912. The bias generator 922 processes the sense signal 924 to generate two bias signals (bias1, bias2) that are coupled to drive the gate terminals of the transistors 902, 904, respectively. In an exemplary embodiment, the bias generator 922 operates to filter the sense signal 924 to generate the bias1 and bias2 signals. In an exemplary embodiment, the bias signals (bias1, bias2) are set so as to reduce asymmetries of the differential output signals V1 and V2.

Thus, the VCO 900 utilizes transistors that are AC coupled in combination with a common mode rejection circuit (i.e., inductor 910). However, it should be noted that either the AC coupling or the CMR circuit could be used independently to reduce asymmetries of the differential output signals (V1, V2).

Figure 10:
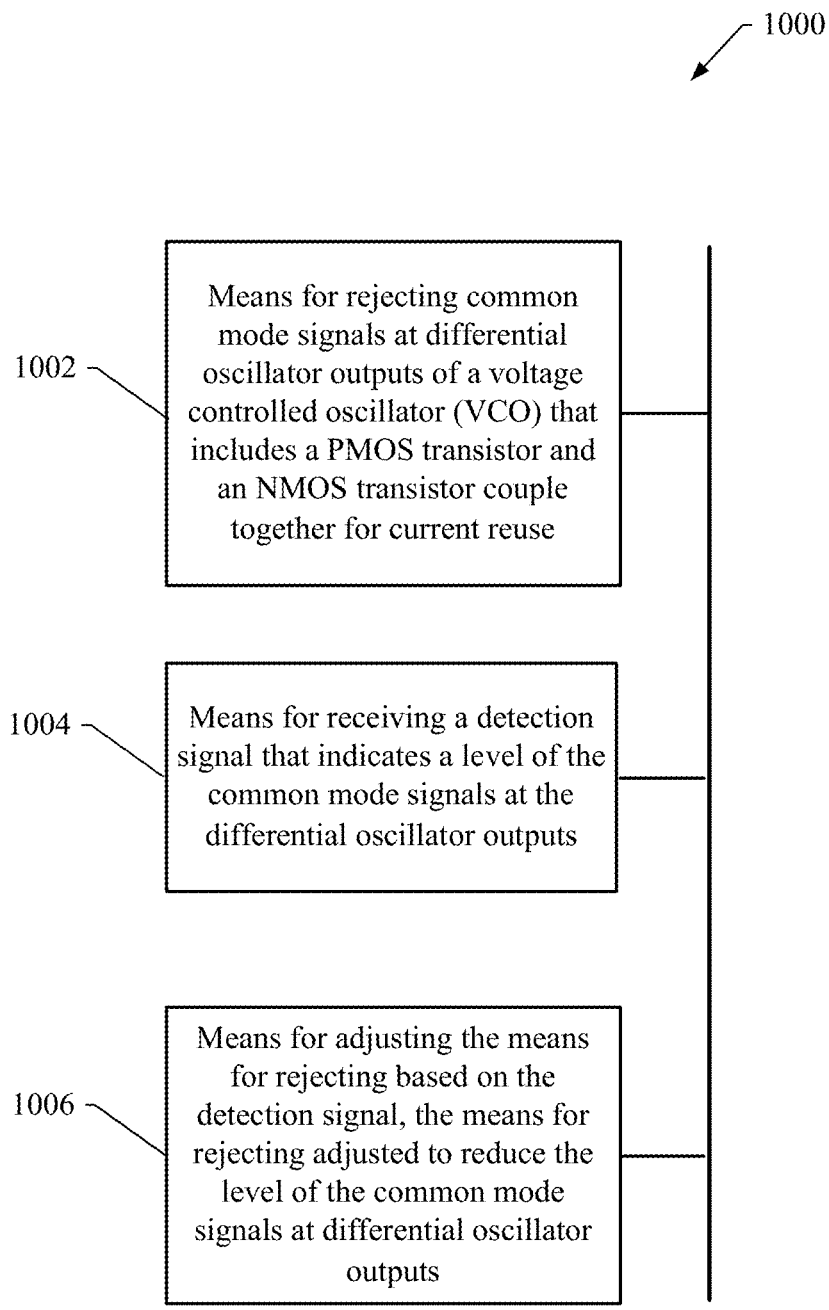
FIG. 10 shows an exemplary embodiment of a current reuse VCO apparatus.

FIG. 10 shows an exemplary embodiment of a current reuse VCO apparatus 1000. For example, the apparatus 1000 is suitable for use as the current reuse VCO 102 shown in FIG. 2. In an aspect, the apparatus 1000 is implemented by one or more modules configured to provide the functions as described herein. For example, in an aspect, each module comprises hardware and/or hardware executing software.

The apparatus 1000 comprises a first module comprising means (1002) for rejecting common mode signals at differential oscillator outputs of a voltage controlled oscillator (VCO) that includes a PMOS transistor and an NMOS transistor couple together for current reuse, which in an aspect comprises the CMR circuit 206.

The apparatus 1000 also comprises a second module comprising means (1004) for receiving a detection signal that indicates a level of the common mode signals at the differential oscillator outputs, which in an aspect comprises controller 214.

The apparatus 1000 also comprises a third module comprising means (1006) for adjusting the means for rejecting based on the detection signal, the means for rejecting adjusted to reduce the level of the common mode signals at differential oscillator outputs, which in an aspect comprises controller 214.

Those of skill in the art would understand that information and signals may be represented or processed using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. It is further noted that transistor types and technologies may be substituted, rearranged or otherwise modified to achieve the same results. For example, circuits shown utilizing PMOS transistors may be modified to use NMOS transistors and vice versa. Thus, the amplifiers disclosed herein may be realized using a variety of transistor types and technologies and are not limited to those transistor types and technologies illustrated in the Drawings. For example, transistors types such as BJT, GaAs, MOSFET or any other transistor technology may be used.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both non-transitory computer storage media and communication media including any medium that facilitates transfer of a computer program from one place to another. A non-transitory storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The description of the disclosed exemplary embodiments is provided to enable any person skilled in the art to make or use the invention. Various modifications to these exemplary embodiments will be readily apparent to those skilled in the art, and the generic principles defined herein may be applied to other embodiments without departing from the spirit or scope of the invention. Thus, the invention is not intended to be limited to the exemplary embodiments shown herein but is to be accorded the widest scope consistent with the principles and novel features disclosed herein.

What is claimed is:

1. An apparatus, comprising:
   a PMOS transistor and an NMOS transistor coupled together for current reuse and configured to provide differential oscillator outputs;
   a common mode rejection (CMR) circuit coupled between the PMOS and the NMOS transistors, the CMR circuit including:
      an inductor having a least one tap that can be selectively coupled to a ground to reduce common mode signals at the differential oscillator outputs;
      at least one capacitor connected to the at least one tap, respectively; and
      at least one switch connected between the ground and the at least one capacitor, respectively, each switch configured to connect and disconnect its associated capacitor to the ground in response to a control signal.

2. The apparatus of claim 1, wherein each tap divides the inductor into first and second inductor portions having first and second inductance values, respectively.

3. The apparatus of claim 2, wherein the at least one tap includes a center tap that divides the inductor so that the first and second inductor portions have substantially equal inductance values.

4. The apparatus of claim 2, wherein the at least one tap includes a selected tap that divides the inductor so that the first and second inductor portions have substantially unequal inductance values.

5. The apparatus of claim 1, further comprising a coarse tuning circuit coupled across the differential oscillator outputs to coarse tune an operating frequency of the apparatus.

6. An apparatus, comprising:
   a PMOS transistor and an NMOS transistor coupled together for current reuse and configured to provide differential oscillator outputs;
   a common mode rejection (CMR) circuit coupled between the PMOS and the NMOS transistors, the CMR circuit includes an inductor having a least one tap that can be selectively coupled to a ground to reduce common mode signals at the differential oscillator outputs; and
   a fine tuning circuit coupled across the differential oscillator outputs to fine tune an operating frequency of the apparatus.

7. An apparatus, comprising:
   a PMOS transistor and an NMOS transistor coupled together for current reuse and configured to provide differential oscillator outputs;
   a common mode rejection (CMR) circuit coupled between the PMOS and the NMOS transistors, the CMR circuit includes an inductor having a least one tap that can be selectively coupled to a ground to reduce common mode signals at the differential oscillator outputs; and
   a controller configured to select a selected tap to be coupled to ground.

8. The apparatus of claim 7, further comprising a detector configured to detect characteristics of the differential oscillator outputs and generate a detection signal based on the detected characteristics.

9. The apparatus of claim 8, the controller configured to select the selected tap based on the detection signal.

10. The apparatus of claim 7, the controller configured to select the selected tap based on a baseband (BB) detection signal.

11. The apparatus of claim 1, the apparatus configured to provide the differential oscillator outputs in a frequency synthesizer of a transceiver.

12. The apparatus of claim 1, the PMOS transistor AC coupled to the NMOS transistor.

13. The apparatus of claim 12, the PMOS transistor and NMOS transistor having gate terminals configured to receive bias signals to reduce asymmetries of the differential oscillator outputs.

14. The apparatus of claim 13, a bias generator coupled to receive a sense voltage from the CMR circuit and to generate the bias signals based on the sense voltage.

15. An apparatus, comprising:
   means for rejecting common mode signals at differential oscillator outputs of a voltage controlled oscillator (VCO) that includes a PMOS transistor and an NMOS transistor coupled together for current reuse;
   means for receiving a detection signal that indicates a level of the common mode signals at the differential oscillator outputs; and
   means for adjusting the means for rejecting based on the detection signal, the means for rejecting adjusted to reduce the level of the common mode signals at differential oscillator outputs.

16. The apparatus of claim 15, the means for rejecting comprising:
  means for providing an inductance coupled between the differential oscillator outputs, the means for providing including at least one tap that divides the inductance into first and second inductance portions having first and second inductance values, respectively.

17. The apparatus of claim 16, the means for adjusting comprising:
  means for selecting a selected tap from the at least one tap; and
  means for coupling the selected tap to a ground to reduce the level of the common mode signals at the differential oscillator outputs.

18. A method for operating a current reuse voltage controlled oscillator (VCO), comprising:
  tuning an output frequency of differential output signals generated from a voltage controlled oscillator (VCO) that includes PMOS transistor and an NMOS transistor coupled together for current reuse;
  receiving a detection signal that indicates a level of common mode signals at the differential oscillator outputs; and
  adjusting a common mode rejection (CMR) circuit coupled between the differential output signals based on the detection signal, the CMR circuit includes an inductor having a least one tap that can be selectively coupled to a ground to reduce the level of the common mode signals at the differential oscillator outputs.

\* \* \* \* \*